United States Patent [19]

Breslow et al.

[11] 3,847,609

[45] Nov. 12, 1974

[54] PHOTOPOLYMER PROCESS FORMING GRAFT POLYMERS IN EXPOSED AREAS

[75] Inventors: David W. Breslow; David A. Simpson, both of Wilmington, Del.

[73] Assignee: Hercules Incorporated, Wilmington, Del.

[22] Filed: Nov. 9, 1972

[21] Appl. No.: 305,209

[52] U.S. Cl. .................... 96/33, 96/35.1, 96/115 P, 204/159.16

[51] Int. Cl. .................... G03f 7/02

[58] Field of Search .................... 96/35.1, 33, 115 P; 204/159.16

[56] References Cited

UNITED STATES PATENTS 3,201,336 8/1965 Magat et al. .................... 204/159.16

3,405,071 10/1968 Reyes .................... 96/75

3,674,591 7/1972 Boyd .................... 204/159.16

3,703,402 11/1972 Cole .................... 204/159.16

*Primary Examiner*—J. Travis Brown

*Attorney, Agent, or Firm*—Marion C. Staves; John W. Whitson

[57] ABSTRACT

The invention concerns a process for making photographic images. The process involves the photooxygenation of a film of an extralinearly unsaturated polymer containing allylic hydrogens, followed by treatment of the exposed film with a reactant which will form a graft polymer structure in the exposed areas of the film.

26 Claims, No Drawings

PHOTOPOLYMER PROCESS FORMING GRAFT POLYMERS IN EXPOSED AREAS

This invention relates to photopolymer compositions and to photopolymer elements, for example, plates embodying a layer of such compositions. More particularly, the invention relates to a process for making lithographic plates.

Compositions capable of being converted under the influence of actinic light to rigid, insoluble, tough structures have become increasingly important in the preparation of printing elements. One of the fundamental patents relating to such compositions is U.S. Pat. No. 2,760,863 to Plambeck. In the process of the Plambeck patent, printing elements are produced directly by exposing to actinic light, through an image bearing process transparency, a layer of an essentially transparent composition containing an addition polymerizable, ethylenically unsaturated monomer and an addition polymerization initiator activatable by actinic light. The layer of polymerizable composition is supported on a suitable support, and exposure of the composition is continued until substantial polymerization of the composition has occurred in the exposed areas with substantially no polymerization occurring in the nonexposed areas. The unchanged material in the latter areas then is removed, as by treatment with a suitable solvent in which the polymerized composition in the exposed areas is insoluble. In the case of printing plates, this results in a raised relief image which corresponds to the transparent image of the transparency and which is suitable for use in letterpress and dry off-set work.

While extremely useful in the preparation of relief printing elements, lithographic printing elements and images from dry transfer processes, certain of the photopolymer compositions of the types disclosed by the Plambeck patent become less sensitive to actinic light due to the diffusion of oxygen from the air into the photopolymer layer. The oxygen acts to inhibit the desired polymerization and cross-linking reactions. There are means of removing or preventing oxygen from saturating or desensitizing the photopolymer layer. One way is to store or treat the element in an essentially oxygen-free atmosphere of an inert gas such as carbon dioxide. This technique gives satisfactory results but requires special equipment and is time consuming. It also is known to add certain metal compounds such as tin salts, which are soluble in the photopolymer composition but which are nonreactive with the addition polymerization initiator. While a number of these compounds substantially reduce the influence of oxygen and improve the photographic speed of the photopolymer element, their utilization has not been entirely satisfactory.

Now, in accordance with this invention, there has been discovered a process for the preparation of printing plates, particularly lithographic plates, including lithographic camera plates, which process is not inhibited by oxygen. As a matter of fact, the process depends upon oxygen being present during the exposure step. The process comprises the steps of providing the surface of a polymer film with a photooxygenation sensitizer, said film being a film of a polymer containing extralinear olefinic unsaturation of the type in which there is no more than one hydrogen atom on each of the double bond carbons and in which there is at least one allylic hydrogen on at least one of the carbons adjacent to the double bond carbons, exposing selected areas of the sensitized film to light having a wave length of from about 2,000 to about 12,000 angstroms in the presence of oxygen and subjecting the exposed film to contact with a reactant capable of forming a graft polymer structure in the exposed areas of the film. This reactant may be either hydrophilic or oleophilic.

Within the meaning of this invention, oleophilic means a surface which accepts greasy ink and hydrophilic means a surface which accepts water. Thus, a hydrophilic reactant is one which is capable of forming a surface which accepts water and is ink repelling. Therefore, for example, if a hydrophilic surface is desired in the exposed areas of the film, such a surface can be obtained directly by using a hydrophilic reactant. However, to obtain such a surface using an oleophilic reactant, the latter must contain a residual functionality after the grafting reaction, which functionality will permit further reaction of the graft with a hydrophilic reactant to provide the desired hydrophilic surface. A related step which is desirable in many instances is one wherein the exposed film after contact with a grafting reactant of a particular type, for example, a hydrophilic reactant, is further contacted with a reactant which is of the same type, for example, hydrophilic, and which is capable of reaction with the functional groups of the graft polymer. This additional step is one of amplification and it can be utilized to increase the hydrophilic character of the light-struck areas and to increase the wear resistance and mass of these areas.

The process essentially involves the grafting of a hydrophilic or oleophilic reactant onto the surface of a film of an unsaturated polymer, and this may be accomplished by two related procedures. The initial reaction in both procedures involves the photosensitized oxidation of a suitably substituted, unsaturated polymer, resulting in the formation of hydroperoxide groups on or near the surface of the polymer film. The polymer hydroperoxides formed in the light-struck areas of the film should be thermally stable and are used in one procedure to graft polymerize a vinyl monomer onto the surface of the film. In the other procedure, the photooxidized film is contacted with a polymeric reactant to form a graft of the reactant on the surface of the film.

The process of this invention is advantageous in that it is possible to utilize low light levels. One reason for this is that the process is not inhibited by oxygen during the exposure step. Also, since amplification may be utilized to increase the mass and the hydrophilic or oleophilic character of the light-struck areas of the polymer film, the intensity of the light needed to obtain an image is decreased. Furthermore, low levels of visible light are operative, thus making it possible to prepare printing plates by projection of a photographic transparency. The process also is applicable to preparation of lithographic camera plates. In this procedure, the copy is exposed to light, the light being absorbed in the dark areas of the copy and reflected by the light areas. The reflected light is passed through a lens system and projected onto the surface of the sensitized polymer film, resulting in photooxidation in the light-struck areas.

The process of this invention is illustrated more specifically by the following examples. In these examples, all parts and percentages are by weight unless otherwise specified.

Example 1

Atlac 382E (Atlas, propoxylated bisphenol-A fumarate polyester resin of M.W. 3000) was modified with 2,3-dimethyl-1,3-butadiene (DMB) in a Diels-Alder reaction. Twenty-five grams Atlac 382E (0.059 mol unsaturation) and 9.70 g. of DMB (0.118 mol, 100% excess), were dissolved in 25.0 g. of reagent grade toluene in a 200.0 ml. polymerization bottle. The reaction was run under air. To prevent cross-linking of the polyester, about 1% hydroquinone was added as an inhibitor. The reaction mixture was heated at 100°C. for 24 hours. (Analysis for unreacted DMB by gas-liquid chromatography indicated the reaction was complete after 22.5 hrs.). The polymer was precipitated by pouring the reaction mixture into about 800.0 ml of rapidly stirring hexane. The solvent was decanted and the gummy polymer was redissolved in benzene, filtered through glass wool, reprecipitated by pouring into hexane, and dried. A study of the product, and of Atlac 382E and hydrogenated Atlac 382E, by nuclear magnetic resonance indicated the polyester was modified 100 ± 4% with DMB. The polymer contains units of the following structure:

photographic transparency. The film was exposed for 60 seconds from a distance of 30 cm. to a 375 watt Sylvania R32 photoflood lamp. During exposure the film was cooled by an air blower. Immediately following exposure the transparency was removed and the film was wiped with a methanol-soaked nonwoven fabric to remove the sensitizer.

A grafting solution was prepared from 15.0 g. of acrylic acid, 0.150 g. of vanadium oxyacetylacetonate (1.0% based on monomer), and 45.0 g. of anhydrous methanol. The resulting solution, containing 25% by weight of acrylic acid, was degassed at −70°C. by evacuation-nitrogen flush cycles. The exposed film was placed in a shallow dish, under a nitrogen atmosphere, and covered with the grafting solution. After 10 minutes contact, the film was removed and rinsed well with methanol to remove any residual monomer. At this point, an image with excellent half-tone definition was clearly visible as a result of grafting to the light-struck areas.

Amplification of the grafted areas of the film with a suitable cationic polymer gave a surface useful for lithographic printing. Amplification was achieved by wiping the acrylic acid grafted film with a five percent

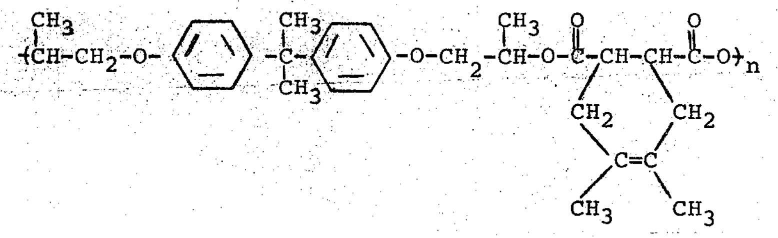

DMB-ATLAC 382E

Films of this polymer were prepared and cross-linked through its terminal groups with trifunctional isocyanate. The following procedure is representative: 1.80 g. of DMB-ATLAC 382E; 0.50 g. of Desmodur N-75 (Naftone, Inc., the reaction product of 3 mols of hexamethylene diisocyanate and 1 mol of water, named as the biuret of hexamethylene diisocyanate and composed principally of a compound believed to have the structure:

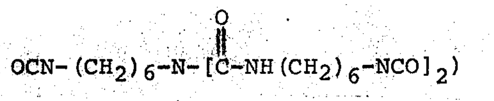

and 0.050 g. zinc octoate (8% Zn) were dissolved under a dry nitrogen atmosphere in 2.70 g. of cellosolve acetate. This solution was used to cast several films on 8 × 8 × 0.003 inch sheets of hard aluminum foil using a 10 mil casting knife. The films were cured at 130°C. for 1½ hours. Casting and curing operations were carried out under a dry nitrogen atmosphere. Cured film thickness was about 3 to 4 mils.

The cured films then were coated with methylene blue sensitizer from a 50/50 (vol./vol.) solution of chloroform/methanol ($3.34 \times 10^{-3}$ mol/l.; Mallinckrodt NF Powder). The sensitizer solution was applied to the films using a camel's hair brush. Methylene blue concentration was about $5.6 \times 10^{-8}$ mol/cm.$^2$. In all examples, sensitizer coating and all subsequent operations were carried out in the dark under a safe light.

A dried, methylene blue-coated film was attached to a glass plate and covered with a half-tone, positive, aqueous solution of Dow PEI 1000 (polyethylenimine of 50,000–100,000 M.W.) containing a small amount of Ultrawet (30-DS, Atlantic Refining Company). The film was then covered with a nonwoven fabric soaked with the PEI solution. After 15 minutes the wipe was removed and the film was rinsed well with water. The dried film was tested as a printing plate on a conventional lithographic press. The amplified surface printed sharp images with good half-tones and excellent ink holdout in the light-struck areas.

Another dried, methylene blue-coated film was exposed through a Stauffer 21 Step Sensitivity Guide (No. AT 20 × 0.15) and grafted as described above. Acrylic acid grafting was clearly visible through Step No. 13, indicating that an image could be produced with a one second exposure under the conditions of the experiment.

Example 2

This example illustrates the use of high molecular weight poly(methacryloxyethyltrimethylammonium methylsulfate) (poly MTMMS) for amplification of an acrylic acid graft. A polymer film of DMB-ATLAC 382E, prepared and cross-linked as described in Example 1, was brush coated with a 33/67 (vol./vol.) solution of methylene blue in chloroform/methanol. Sensitizer concentration was the same as in Example 1. The film was exposed for 60 seconds and grafted with acrylic acid for five minutes as described in Example 1. The grafted film was amplified with a 10% aqueous solution (RSV, 3.3) of the poly MTMMS using the procedure outlined in Example 1. The amplified surface printed images with excellent half-tone definition and excellent ink holdout in the light-struck areas.

Example 3

This example illustrates the use of methacryloxyethyltrimethylammonium methylsulfate (MTMMS) and a high molecular weight copolymer of sodium sulfopropylacrylate-acrylamide as the grafting and amplification materials, respectively. The grafting solution was prepared from 6.25 g. of MTMMS, 0.062 g. of vanadium oxyacetylacetonate (1.0% based on the MTMMS) and 18.8 g. of anhydrous methanol. The resulting solution, containing 25% by weight of MTMMS, was degassed at −70°C. by evacuation-nitrogen flush cycles.

Two polymer films of DMB-ATLAC 382E were prepared, cross-linked, sensitizer coated and exposed as described in Example 1. Both films were contacted with the grafting solution for 10 minutes following the procedure of Example 1. After rinsing with methanol, the films showed sharp images with excellent halftones. One of the films was amplified with a one percent aqueous solution of a sodium sulfopropylacrylate (40%) - acrylamide (60%) copolymer (RSV of 0.1% solution of the polymer, 19.9) as described in Example 1. The amplified and unamplified films were run simultaneously on a conventional lithographic press. The unamplified film printed images with good definition, but the light-struck areas did not reject ink completely. On the other hand, the amplified film exhibited excellent ink rejection, the light-struck areas being indistinguishable from the white of the paper. These images were quite sharp, with excellent half-tone definition.

Example 4

This example illustrates the use of rose bengal as a sensitizer. A film of DMB-ATLAC 382E, prepared and cross-linked as described in Example 1, was brush coated with a methanol solution of rose bengal ($2.88 \times 10^{-3}$ mol/l.; Polyscience Inc.). Sensitizer concentration was about $4.80 \times 10^{-8}$ mol/cm.². The film was covered with a photographic transparency and taped to the surface of a glass vessel containing ice water; additional cooling was provided by an air blower. The film was exposed for 60 seconds from a distance of 30 cm. to a Sylvania Super 8 Sun-Gun movie light with a DVY 650 watt tungsten halogen lamp. Following removal of the sensitizer as in Example 1, the film was contacted for five minutes with the 25% acrylic acid grafting solution of Example 1, following the procedure of that example. After rinsing in methanol, a sharp grafted image with good halftones was visible.

Example 5

This example illustrates the use of meso-tetraphenylporphin as a sensitizer and the use of a lower concentration of grafting monomer. A film of DMB-ATLAC 382E, prepared and cross-linked as described in Example 1, was brush-coated with a 70/30 (vol./vol.) solution of meso-tetraphenylporphin in benzene/methanol ($5.54 \times 10^{-3}$ mol/l.). Sensitizer concentration was about $9.2 \times 10^{-8}$ mol/cm.². As described in Example 4, the film was exposed and then contacted for 5 minutes with a 10% arcylic acid grafting solution. The grafting solution was prepared from 5.00 g. of acrylic acid, 0.050 g. of vanadium oxyacetylacetonate and 45.0 g. of anhydrous methanol as outlined in Example 1. After rinsing the film with methanol, a grafted image with excellent half-tone definition was visible.

Example 6

This example illustrates the use of sodium 2-sulfoethylmethacrylate (SSEM) as the grafting monomer. A film of DMB-ATLAC 382E, prepared and cross-linked as described in Example 1, was brush-coated with meso-tetraphenylporphin and exposed as outlined in Example 5. The film was contacted with an 8.6% SSEM grafting solution prepared from 1.20 g. of SSEM, 0.012 g. of vanadium oxyacetylacetonate, 10.8 g. of methanol and 2.0 g. of water. After 15 minutes contact, the film was rinsed with methanol, yielding a grafted image with good half-tone definition.

Example 7

This example illustrates the use of a tri-substituted, extralinear unsaturated, polymer substrate and a low molecular weight polyethylenimine (PEI) for acrylic acid amplification. ATLAC 382E was modified 95 ± 5% with isoprene (IP) in a Diels-Alder reaction. The polymer contains units of the following structure:

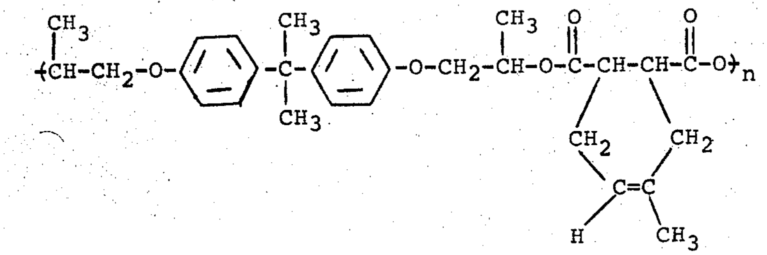

A film of IP-ATLAC 382E, prepared and cross-linked as described in Example 1, was brush coated with meso-tetraphenylporphin and exposed for 120 seconds as outlined in Example 5. Grafting with the 25% arcylic acid solution of Example 1, followed by the usual work up, gave a sharp grafted image. The film was amplified by wiping with a 10% aqueous solution of Dow PEI Montrek 18 (polyethylenimine of 1800 M.W.) containing a small amount of Ultrawet. After wiping, the film was allowed to stand for five minutes under a nonwoven fabric soaked with the PEI solution. The film was rinsed well with water and run on a conventional lithographic press. The amplified surface printed sharp images with excellent half-tones and good ink hold-out in the light-struck areas.

Example 8

This example illustrates the use of a dye to develop the grafted image. A DMB-ATLAC 382E film was imaged and grafted with acrylic acid as described in Example 1. The grafted film was dipped into a hot, 0.5% aqueous solution of a basic dye, Rhodamine B (DuPont, Basic Violet 10, CI No. 45170), and then into hot water. A sharp image was produced, with excellent definition. The light-struck, acrylic acid grafted areas accepted the basic dye while the unexposed areas remained colorless. Malachite Green (CI No. 42,000), another basic dye, gave similar results with an acrylic acid grafted film.

Example 9

This example illustrates grafting via reaction with a photooxidized film. A film of DMB-ATLAC 382E, prepared and cross-linked as described in Example 1, was brush coated with a benzene solution of meso-tetraphenylporphin and molybdenum hexacarbonyl catalyst. Sensitizer and catalyst concentrations were about 1.0 $\times 10^{-7}$ mol/cm.$^2$ and 8.9 $\times 10^{-7}$ mol/cm.$^2$, respectively. The film was exposed for 5 minutes as described in Example 4 and immediately covered with a 50% solution of Dow PEI Montrek 18 in methanol. The film was allowed to remain in contact with the PEI solution for 24 hours in the dark under ambient conditions. After rinsing with methanol, a sharp grafted image was visible. The grafted film was soaked under a nonwoven fabric wet with 1 M HCl for about 10 minutes, rinsed with water, dried, and run on a conventional lithographic press. The film printed good images with excellent half-tones and good ink hold-out in the light-struck areas.

Example 10

This example illustrates grafting via reaction with a photooxidized film. A film of DMB-ATLAC 382E, prepared and cross-linked as described in Example 1, was soaked for 15 minutes in 75/25 (vol./vol.) methanol/benzene containing 0.80 g. of methylene blue per liter of solution. The film was air-dried and the surface gently wiped with a methanol soaked nonwoven fabric. The film was exposed through a Stauffer 21 Step Sensitivity Guide (AT20 $\times$ 0.15) for 5 minutes from a distance of 60 cm. to a 375 watt Sylvania R32 photoflood lamp. During exposure, the surface of the film was cooled by an air blower. Immediately following exposure the film was placed in diethylenetriamine and allowed to soak for 22 hours in the dark under ambient conditions. After rinsing with methanol and water, a sharp grafted image was visible through Step No. 12. The grafted film was soaked in aqueous Acid Green 25 dye (CI No. 61570) and the grafted areas were selectively dyed, producing a sharp image.

Example 11

This example illustrates grafting via reaction with a photooxidized film. A film of DMB-ATLAC 382E, prepared and cross-linked as described in Example 1, was sensitized with methylene blue as described in Example 10. The film was exposed as described in Example 10 and allowed to soak for 22 hours in a 50% solution of Dow PEI Montrek 18 in methanol as described in Example 9. After rinsing the film with methanol and water, a sharp grafted image was visible through Step No. 9. The grafted film was treated with 1 M HCl as described in Example 9 and run on a conventional lithographic press. The film printed a good image with good ink hold-out in the light-struck areas.

Example 12

This and the following example are concerned with attempts to photochemically initiate graft-polymerization of acrylic acid to polymer films containing intralinear unsaturation.

A two-gram sample of styrene - 2,3-dimethyl-1,3-butadiene rubber (82 mol. % unsaturation and 91% 1,4-addition), containing units of the structure given below, was dissolved in 20 ml. of benzene containing 0.68 g. of the poly(azidoformate) of the polyol obtained by hydrogenolysis of dimerized tall oil fatty acids (U.S. Pat. No. 3,696,126 to Breslow). This solution was used to cast several films on hard aluminum foil with a 20 mil casting knife.

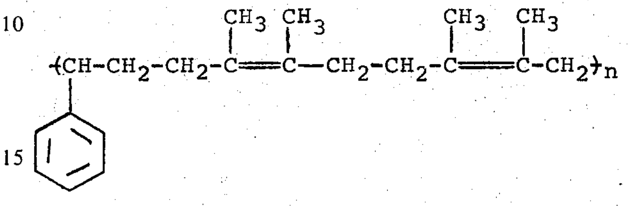

After air drying, the films were transferred to a vacuum oven at room temperature and the system was degassed by two evacuation-nitrogen flush cycles. Crosslinking of the rubber was achieved by heating the films under nitrogen at 140°C. for two hours. Cured film thickness was about one mil. The cured films were brush coated with methylene blue from a 25/75 (vol./vol.) solution of chloroform/methanol. Sensitizer concentration was about 2.3 $\times 10^{-8}$ mol/cm.$^2$.

One of the coated films was exposed through the Stauffer Sensitivity Guide for 60 seconds from a distance of 60 cm. to a 375 watt Sylvania R32 photoflood lamp. Attempted acrylic acid grafting was carried out as described in Example 1. Examination of the film indicated that no detectable amount of grafting had occurred. The film was placed in an aqueous solution of Malachite Green, a basic dye, for 1 hour, but the exposed areas failed to pick up any color. No image could be detected.

Example 13

The poly(azidoformate) of Example 12, in the amount of 0.34 g., was dissolved in 20.0 g. of a 5 percent solution of pale crepe natural rubber in benzene. The solution was used to cast a 20 mil film which was air-dried, cured, sensitizer coated, exposed and subjected to attempted grafting, as described in Example 12. No image was visible after the attempted grafting. Attempts to develop an image with Malachite Green also were unsuccessful.

Identical results were obtained using cis-polyisoprene (Shell 500) as the intralinear unsaturated substrate. No images could be detected.

Example 14

This example illustrates the grafting of methyl methacrylate to a film of ethylene-propylene-ethylidenenorbornene terpolymer rubber (EPsyn 40-A EPDM, Copolymer Rubber and Chemical Corp.). In this example the sensitizer was dissolved in the film.

The EPsyn 40-A EPDM rubber was purified by dissolving it in benzene and precipitating it with methanol. A 5.0% benzene solution of the purified rubber then was prepared and 0.50% (based on the rubber) of meso-tetraphenylporphin was added. This solution was used to cast a film on a grained Mylar substrate. An identical film of EPsyn 40-A EPDM was cast adjacent to the first, but this one contained no sensitizer. The films were exposed for five minutes as described in Example 4 and contacted with a grafting solution prepared from 16.7 g. of methyl methacrylate, 0.053 g. of vanadium oxyacetylacetonate and 50.0 g. of anhydrous methanol. The grafting solution was prepared and degassed as previously described. After 62 minutes contact, followed by rinsing with methanol, the film containing sensitizer was heavily grafted in the light-struck areas. The grafted areas were hard and exhibited considerable relief. The film containing no sensitizer remained unchanged.

Example 15

This example illustrates the use of a modified poly(vinyl alcohol) as the polymer substrate. The poly(vinyl alcohol) was modified with 1,2,4-trimethyl-4-chlorocarbonylcyclohexene to contain extralinear tetra-substituted double bonds.

Four grams of dried Gelvatol 20–30 [Monsanto, 88–89% hydrolyzed poly(vinyl acetate) of M.W. 10,000, 0.073 mol hydroxyl] and 100.0 ml. of dry dimethylformamide (DMF) were heated and stirred at 100–110°C. under nitrogen until solution was achieved. Then 7.05 g. (0.070 mol) of triethylamine was added. A solution of 12.9 g. (0.069 mol) of 1,2,4-trimethyl-4-chlorocarbonylcyclohexene in 10.0 ml. of dry DMF was added dropwise to the reaction mixture with rapid stirring at 105–110°C. The solution was then allowed to stand for about 60 hours at ambient temperature. The reaction mixture was filtered and concentrated under vacuum. The gelatinous residue was dissolved in 100.0 ml. of hot acetone and poured into 400.0 ml. of rapidly stirring water. The liquid was decanted and the gum was washed thoroughly with pentane. The polymer was dissolved in acetone and precipitated again. The resulting orange, rubbery material was dried at 50–60°C. under pump vacuum for about 12 hours.

Films were cast and cross-linked as described in Example 1. The following solution was prepared and used for film casting: 3.5 g. of the modified poly(vinyl alcohol); 0.55 g. of Desmodur N-75; two drops of zinc octoate (8% Zn); and 10.0 ml. of cellosolve acetate.

A sample film was coated with methylene blue, exposed, and grafted with acrylic acid as described in Example 1. The grafted film was soaked for several minutes in a solution of Malachite Green. The light-struck, acrylic acid grafted areas were selectively dyed, producing a sharp image.

Example 16

This example illustrates the use of a modified phenoxy resin as the polymer substrate. The resin was modified with 1,2,4-trimethyl-4-chlorocarbonylcyclohexene to contain extralinear tetra-substituted double bonds.

Fourteen and two-tenths grams of dried PKHC (Union Carbide, phenoxy resin of M.W. 30,000, 0.050 mol hydroxyl) was dissolved in 150.0 ml. of methylene chloride under nitrogen. Then 4.80 g. (0.047 mol) of triethylamine was added. A solution of 8.76 g. (0.047 mol) of 1,2,4-trimethyl-4-chlorocarbonylcyclohexene in 10.0 ml. of methylene chloride was added dropwise to the reaction mixture at ambient temperature. The solution was allowed to stand for about 4 days. The polymer was precipitated by pouring the reaction mixture into 500.0 ml. of rapidly stirring methanol, redissolved in a minimum of methylene chloride and precipitated two more times, and finally dried at 50–65°C. under pump vacuum for about 12 hours.

Films were cast and cross-linked as described in Example 1. The following solution was prepared and used for film coating: 4.25 g. of the modified phenoxy resin; 0.25 g. of Desmodur N-75; one drop of zinc octoate (8% Zn); and 10.0 ml. of cellosolve acetate.

A sample film was coated with methylene blue and exposed through the Stauffer Sensitivity Guide as described in Example 12. Acrylic acid grafting was carried out as described in Example 1. The grafted film was dyed with aqueous Malachite Green. A sharp image was produced, with solid dye pick-up through Step No. 11, and traces of dye were visible through Step No. 15.

Example 17

This example illustrates the use of a modified hydroxypropyl cellulose as the polymer substrate. The cellulose derivative was modified with 1,2,4-trimethyl-4-chlorocarbonylcyclohexene to contain extralinear tetra-substituted double bonds.

Thirteen and four-tenths grams (0.060 mol hydroxyl) of dried Klucel LF (Hercules, hydroxypropyl cellulose of M.W. 75,000) was dissolved in 300.0 ml. of dry tetrahydrofuran (THF) under nitrogen. Then 4.0 g. (0.040 mol) of triethylamine was added. A solution of 11.2 g. (0.030 mol) of 1,2,4-trimethyl-4-chlorocarbonylcyclohexene in 10.0 ml. of dry THF was added dropwise to the reaction mixture at ambient temperature. The solution was heated at 40°C. for 30 hours and then allowed to stand for about 60 hours at ambient temperature. The reaction mixture was concentrated under vacuum and the polymer was precipitated by pouring into 1 liter of water. The rubbery material was redissolved in THF and precipitated again from water. The polymer was dried at 60°C. under pump vacuum for about 2 days.

Films were cast and cross-linked as described in Example 1. The following solution was prepared and used for film casting: 4.25 g. of the modified hydroxypropyl cellulose; 0.25 g. of Desmodur N-75; one drop of zinc octoate (8% Zn); and 11.0 ml. of methylene chloride. Since methylene chloride was used as the solvent, the films were allowed to dry under nitrogen at room temperature for 1 to 2 hours before curing. The films were cured at 120°C for 2 hours.

A sample film was sensitizer coated, exposed, grafted, and dyed as described in Example 16. A sharp image was produced, with solid dye pick-up through Step No. 7, and traces of dye were visible through Step No. 15.

Example 18

This example illustrates the use of a phenoxy resin modified with 4,5-dimethyl-4-hexen-1-ol as the polymer substrate.

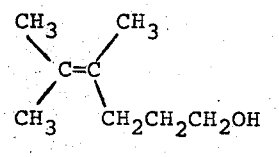

To a solution of 5.2 g. (0.03 mol) of 2,4-toluenediisocyanate in 15 ml. of dry ethyl acetate was added 3.8 g. (0.03 mol) of 4,5-dimethyl-4-hexen-1-ol. The solution was allowed to stand at room temperature for 5 days. Fifty milligrams of stannous octoate was added, and the solution refluxed for 3 hours.

The solvent was stripped off under reduced pressure and the residue added to a solution of 11.4 g. (0.04 eq. hydroxyl) of Phenoxy Resin PKHC (Union Carbide) and 0.05 g. of stannous octoate in 125 ml. of cellosolve acetate. The resulting solution was heated at 110°C. for 8 hours, cooled and poured into 500 ml. of methanol. The solids were separated and taken up in methylene chloride. The polymer was precipitated in hexane and dried under vacuum. Analysis indicated that about 20% of the available hydroxyls in the starting polymers had been reacted.

A 2-mil cross-linked film of the above polymer was prepared by drawing out a solution of 3.0 g. of the polymer in 14 ml. of cellosolve acetate containing 0.20 g. of Desmodur N-75 and 0.02 g. of zinc octoate, and baking at 130°C. for 1½ hours.

The cured film was soaked for 15 minutes in a solution of 0.80 g. of methylene blue in 50/50 chloroform/-benzene. The film was allowed to dry overnight and exposed as described in Example 12. The exposed film was grafted as described in Example 1 using a solution of 15 ml. of acrylic acid, 15 ml. of methanol, and 30 mg. of vanadium oxyacetylacetonate. Grafted material was observed through Step No. 12.

Example 19

This example illustrates the use of an ethylene-vinyl alcohol copolymer modified with p-(2,3,-dimethyl-prop-2-enyl) benzoyl chloride as the polymer substrate, and acrylamide as the grafting monomer.

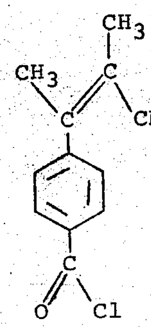

p-(2,3-Dimethylprop-2-enyl) benzoic acid was prepared according to the procedure of G. P. Newsoroff and S. Sternhell, Aust. J. Chem., 19, 1667 (1966). The benzoic acid was converted to the acid chloride, b.p. 112°C. (1.7 mm), by treatment with thionyl chloride.

Dried ethylene-vinyl alcohol copolymer (Dupont Elvon 20B, 10.0 gm., $3.57 \times 10^{-2}$ mol hydroxyl) was dissolved in 100 ml. of refluxing benzene under nitrogen. After the polymer dissolved, the solution was allowed to cool to 65°C. and pyridine, 2.12 gm. ($2.68 \times 10^{-2}$ mol), was added. A solution of p-(2,3-dimethyl-prop-2-enyl) benzoyl chloride, 5.59 gm. ($2.68 \times 10^{-2}$ mol), in 10 ml. of benzene was added dropwise to the reaction mixture.

The mixture was then heated and stirred in an 80°C. oil bath for about 50 hours, and then stirred at an ambient temperature for about 3 days. The polymer was precipitated by filtering the reaction mixture into 1600 ml. of rapidly stirring methanol. The white rubbery solid was isolated by filtration, redissolved in a minimum of benzene and precipitated two more times from methanol, and finally dried at ambient temperature under pump vacuum for about 12 hours.

Films were cast and cross-linked as described in Example 1. The following solution was prepared and used for film coating: 3.00 gm. of the modified polymer; 0.70 gm. Desmodur N-75; 0.070 gm. zinc octoate (8% Zn); and 13.8 ml. of dried xylene.

A sample film was soaked for about 45 hours in 25/75 (vol./vol.) methanol/benzene containing 0.80 gm. of methylene blue per liter of solution. The film was dried under pump vacuum for about 2 hours and the film surface was gently wiped with a methanol soaked nonwoven fabric. The film was exposed through a Stauffer 21 Step Sensitivity Guide (No. AT 20 × 0.15) for 60 seconds from a distance of 60 cm. to a 375 watt Sylvania R32 photoflood lamp.

Immediately following exposure the step guide was removed and the film was degassed under pump vacuum for 15 minutes. The film was then grafted with a 28% solution of acrylamide in 50/50 (vol./vol.) benzene/methanol containing 0.40% vanadium oxyacetylacetonate (based on monomer). The grafting procedure of Example 1 was followed but grafting was continued for 30 minutes. The grafted film printed a sharp image with excellent ink hold-out through Step No. 14.

Example 20

This example illustrates the use of a vinyl chloride-vinyl alcohol copolymer modified with β-(5-methyl-2-furyl)-propionyl chloride as the polymer substrate.

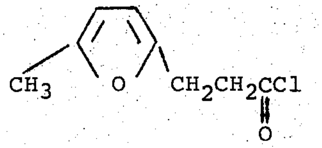

The vinyl chloride-vinyl alcohol copolymer was prepared by complete hydrolysis of Bakelite VYHH (vinyl chloride-vinyl acetate copolymer, 13% vinyl acetate; Union Carbide). The dried polymer (0.100 mol hydroxyl) was dissolved in dry THF under nitrogen. Pyridine in the amount of 0.095 mol was added. A solution of β-(5-methyl-2-furyl)propionyl chloride in the amount of 0.095 mol in THF was added dropwise with stirring at ambient temperature. After 24 hours, the solution was concentrated and the polymer precipitated by pouring into water. After a second precipitation, the polymer was dried at 50°C. under pump vacuum for one day.

Films were cast and cross-linked as described in Example 1. A sample film was coated with methylene blue, exposed, soaked in methanol for several minutes, and grafted with MTMMS, as described in Example 3. After rinsing with methanol, a sharp grafted image was visible. Amplification of the grafted film with a one percent aqueous solution of a sodium sulfopropylacrylate-acrylamide copolymer, as in Example 3, gave a surface which printed excellent images on a conventional lithographic press.

Example 21

This example illustrates the use of a modified isophthalic polyester as the polymer substrate.

Isopolyester Resin CR-19583 (FA) (based on propylene glycol, and isophthalic and fumaric acids in a 1/1 mol ratio; Chevron Chemical Co., Oronite Division) was modified essentially 100% with 2,3-dimethyl-1,3-butadiene in a Diels-Alder reaction as outlined in Example 1. Films of the modified polyester were cast, cross-linked, sensitizer coated, and grafted as described in Example 1. An image with excellent half-tone definition was clearly visible.

Example 22

This example illustrates the use of a series of metal salts as catalysts to initiate graft polymerization of vinyl monomers. Polymer films of DMB-ATLAC 382E were prepared and exposed as described in Example 1. Following removal of the sensitizer the films were contacted with the degassed grafting solutions listed below. After 30 minutes, the films were removed from the grafting solutions, rinsed for 5 minutes in methanol, and examinec for image formation. In each case a ctear, grafted image with excellent half-tone definition was observed.

The grafting solutions were 25% by weight in monomer and 1.0% by weight (based on monomer) in catalyst.

A. titanyl acetylacetonate, 0.064 gm.
acrylic acid, 6.4 gm.
methanol, 14.3 gm.
benzene, 4.8 gm.

B. ferric acetylacetonate, 0.064 gm.
benzoin, 0.37 gm.
acrylic acid, 6.4 gm.
methanol, 19.1 gm.

C. manganese octate, 0.064 gm. (6% Mn, Shepherd Chemical Company)
acrylic acid, 6.4 gm.
methanol, 17.3 gm.
benzene, 1.8 gm.

D. lead naphthenate, 64 microliters (37% Pb, Shepherd Chemical Company)
glycidyl acrylate, 6.4 gm.
methanol, 17.3 gm.
benzene, 1.8 gm.

E. ferric acetylacetonate, 0.064 gm.
benzoin, 0.37 gm.
glycidyl acrylate, 6.4 gm.
methanol, 19.1 gm.

F. cobaltous acetylacetonate, 0.064 gm. (22.9% Co, Shepherd Chemical Company)
glycidyl acrylate, 6.4 gm.
methanol, 19.1 gm.

G. Advacat 14, 0.064 gm. (4.0% Co, Cincinnati Milacron)
acrylic acid, 6.4 gm.
methanol, 19.1 gm.

H. magnesium acetylacetonate, 0.064 gm. (Chemicals Procurement Laboratories, Inc.)
acrylic acid, 6.4 gm.
methanol, 19.1 gm.

I. titanyl acetylacetonate, 0.064 gm.
methacryloxyethyltrimethylammonium chloride, 6.4 gm.
methanol 19.1 gm.

J. cobaltic acetylacetonate, 0.064 gm. (K & K Laboratories, Inc.)
acrylic acid, 6.4 gm.
methanol, 19.1 gm.

Example 23

This example illustrates the use of sensitizer in the film and acrylamide as the grafting monomer. A film of DMB-ATLAC 382E, prepared and cross-linked as described in Example 1, was soaked for 15 minutes in 50/50 (vol./vol.) chloroform/methanol containing 0.80 gm. of methylene blue per liter of solution. The dyed film was blotted with a nonwoven fabric, dried, and covered with a Stauffer 21 Step Sensitivity Guide (No. AT 20 × 0.15) and a positive half-tone screen. The film was exposed for 60 seconds from a distance of 60 cm. to a 375 watt Sylvania R32 photoflood lamp. Immediately following exposure the transparencies were removed and the film was grafted with a 25% solution of acrylamide in 10/90 (vol./vol.) benzene/methanol containing 0.40% vanadium oxyacetylacetonate (based on monomer), as described in Example 1. The grafted film printed a sharp image with good half-tones and excellent ink hold-out through Step No. 11.

Example 24

This example illustrates the use of dimethyl acrylamide as the grafting monomer. A film of DMB-ATLAC 382E was prepared and exposed as described in Example 23. The film was grafted with a 25% solution of dimethyl acrylamide in methanol containing 0.40% vanadium oxyacetylacetonate (based on monomer), as described in Example 1. The grafted film printed a good image with excellent ink hold-out through Step No. 11.

Example 25

This example illustrates the use of hydroxymethyl acrylamide as the grafting monomer. The procedure of Example 24 was followed using hydroxymethyl acrylamide as the monomer. The grafted film printed a good image with excellent ink hold-out through Step No. 12.

Example 26

This example illustrates the use of polyethylene glycol 400 diacrylate (Polyscience Inc.) as the grafting monomer. A film of DMB-ATLAC 382E was prepared and exposed as described in Example 23. The film was grafted with a 25% solution of the diacrylate in 10/90 (vol./vol.) benzene/methanol containing 0.40% vanadium oxyacetylacetonate, as described in Example 1. The grafted film printed a sharp image with good half-tones and excellent ink hold-out.

Example 27

This example illustrates the reaction of grafted acrylic acid with an aluminum salt to give a surface useful for lithographic printing. A film of DMB-ATLAC 382E was prepared and exposed as described in Example 23. The film was then grafted with acrylic acid as described in Example 1.

Treatment of the grafted film with 0.1 M $Al^{+3}$ [$Al_2(SO_4)_3$] in water for one-half hour, followed by soaking for one hour in water, gave a film which printed a sharp image with good half-tones and excellent ink hold-out through Step No. 5.

Example 28

This example illustrates the reaction of grafted acrylic acid with a zirconium salt to give a surface useful for lithographic printing. The procedure of Example 27 was followed using 0.1 M $Zr^{+4}$ [$Zr(SO_4)_2$]. The treated film printed a sharp image with good half-tones and excellent ink hold-out through Step No. 10.

Example 29

This example illustrates the reaction of grafted acrylic acid with a chromium salt to give a surface useful for lithographic printing. The procedure of Example 27 was followed using 0.1 M $Cr^{+3}$ [$CrK(SO_4)_2 \cdot 12H_2O$].

The treated film printed a sharp image with good half-tones.

Example 30

This example illustrates the reaction of grafted acrylic acid with a zinc salt to give a surface useful for lithographic printing. The procedure of Example 27 was followed using 0.1 M $Zn^{+2}$ ($ZnCl_2$). The treated film printed a sharp image with good half-tones and excellent ink hold-out through Step No. 5.

Example 31

This example illustrates the use of a series of sensitizers. Polymer films of DMB-ATLAC 382E were prepared as described in Example 1. The cured films were brush coated with solutions of the sensitizers at the concentrations listed below. The sensitized films were covered with a half-tone, positive, photographic transparency and exposed for 60 seconds from a distance of 60 cm. to a 375 watt Sylvania R32 photoflood lamp. The exposed films were grafted with acrylic acid as described in Example 1 using 0.40% vanadium oxyacetylacetonate. In each case a clear, grafted image with excellent half-tone definition was observed.

| Sensitizer | Coating Solution | Amount and Concentration of Sensitizer Solution Coated Per 25 $cm^2$ Of Film |
|---|---|---|
| eosin Y | 50/50 (vol./vol.) $CHCl_3/CH_3OH$ | 0.5 ml. of 0.010 gm. in 25 ml. |
| crystal violet | do. | do. |
| methylene green | do. | do. |
| safranine bluish (6B) | do. | do. |
| 1,1-diethyl-2,2'-cyanine iodide | do. | do. |
| 1-ethyl-2-[3-(1-ethylnaphtho-[1,2d]-thiazolin-2-ylidine)-2-methylpropenyl]-naphtho-[1,2d]-thiazolium bromide | do. | do. |
| pinacyanol chloride | do. | do. |
| ethyl red | do. | do. |
| 1,1'-diethyl-2,2'-dicarbocyanine iodide | do. | do. |
| 3,3'-diethyloxycarbocyanine iodide | do. | do. |
| 3,3'-diethyl thiazolino carbocyanine iodide | do. | do. |
| zinc tetraphenylporphin | 50/50 (vol./vol.) $C_6H_6/CH_3OH$ | do. |
| fluorescein | do. | do. |
| methylene violet | do. | do. |
| methylene blue oleate | do. | 0.5 ml. of 0.016 gm. in 25 ml. |
| methylene blue dodecyl benzene sulfonate | do. | 0.5 ml. of 0.017 gm. in 25 ml. |
| copper phthalocyanine | do. | 0.5 ml. of 0.006 gm. in 10 ml. |
| pentacene | do. | 0.5 ml. of 0.010 gm. in 10 ml. |
| napthacene | do. | do. |
| copper tetraphenylporphin | do. | 0.5 ml. of 0.011 gm. in 10 ml. |
| tin tetraphenylporphin | 50/50 (vol./vol.) $C_6H_6/CH_3OH$ | 0.5 ml. of 0.012 gm. in 10 ml. |
| acridine orange | do. | 0.5 ml. of 0.015 gm. in 25 ml. |
| methylene violet, Bernthsen | do. | 0.5 ml. of 0.010 gm. in 25 ml. |

Example 32

This example illustrates the grafting of a vinyl monomer containing an epoxide group and conversion of the graft into a surface useful in lithography. A film of DMB-ATLAC 382E was prepared and cross-linked as described in Example 1. The film was sensitized with methylene blue and exposed through a Stauffer 21 Step Sensitivity Guide as described in Example 23. Immediately following exposure the step guides were removed and the film was degassed under pump vacuum for 15 minutes. The film was then grafted with an 18% solution of glycidyl acrylate in methanol containing 0.67% vanadium oxyacetylacetonate (based on monomer). The grafting procedure of Example 1 was followed. The film exhibited a sharp grafted image through Step No. 8.

Amplification of the grafted film with polyethylenimine gave a surface useful for lithographic printing. Amplification was achieved by wiping the glycidyl acrylate grafted film with Dow PEI Montrek 18 containing 10% phenol. The coated film was heated in a dark oven at 100°C. for 30 min. under nitrogen. After heating, the film was rinsed with methanol, soaked for 15 minutes in 1 M HCl, rinsed with water, dried, and run on a conventional lithographic press. The film printed a sharp image with excellent ink hold-out in the light-struck areas.

Example 33

This example illustrates the grafting of a vinyl monomer containing a group reactive to nucleophilic displacement and conversion of the graft into a surface useful in lithography. A film of DMB-ATLAC 382E was prepared and cross-linked as described in Example 1. The film was sensitized with methylene blue and exposed through a Stauffer 21 Step Sensitivity Guide as described in Example 23. Immediately following exposure, the step guides were removed and the film was degassed under pump vacuum for 15 minutes. The film was then grafted with a 25% solution of vinylbenzyl chloride in methanol containing 1.0% vanadium oxyacetylacetonate (based on monomer). The grafting procedure of Example 1 was followed but grafting was continued for 30 minutes. The film exhibited a sharp grafted image through Step No. 9.

Amplification of the grafted film with polyethylenimine gave a surface useful for lithographic printing. Amplification was achieved by soaking the grafted film for 2 hours at room temperature in a solution containing 7.5 g. Dow PEI Montrek 18, 0.10 g. p-toluenesulfonic acid silver salt, and 2.5 g. acetonitrile. Following amplification, the film was rinsed with methanol, soaked in 1 M HCl for 15 minutes, rinsed with water, dried, and run on a conventional lithographic press. The film printed a sharp image with good ink hold-out in the light-struck areas.

The polymers used in the process of this invention preferably are oleophilic, and they should be capable of being formed into durable, solvent-resistant films. They should contain at least 0.01%, and preferably at least 0.2%, by weight of extralinear olefinic unsaturation of the type in which there is no more than one hydrogen atom on each of the double bond carbons and in which there is at least one allylic hydrogen on at least one of the carbons adjacent to the double bond carbons. An example of this type of unsaturation is illustrated by the structural unit

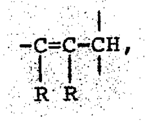
in in which R is hydrogen or $C_1$–$C_6$ alkyl. Some polymers, such as certain EPDM rubbers, contain this type of unsaturation already built into the polymer structure. However in other instances, the olefinic unsaturation must be introduced into a base polymer. Exemplary of such base polymers are unsaturated polyesters and certain copolymers of ethylene and substituted dienes. Also, since esterification reactions may be used to introduce the olefinic unsaturation into polymers containing hydroxyl groups, the base polymers may include polymers such as poly(vinyl alcohol) and poly(vinyl acetate) which has been partly hydrolyzed partly or completely hydrolyzed copolymers of vinyl acetate with other vinyl monomers such as vinyl chloride; cellulose and cellulose esters; starch; cellulose which has been partly or completely reacted with an alkylene oxide, such as ethylene oxide or propylene oxide, for example, hydroxyethyl cellulose or hydroxypropyl cellulose; phenoxy resins and other resins prepared by condensing a polyhydroxy compound with epichlorohydrin; polymers or copolymers of hydroxyalkyl acrylates or methacrylates; polymers or copolymers of hydroxyalkyl vinyl sulfides; and polymers or copolymers of hydroxyalkyl acrylamides.

The reactant utilized to introduce the extralinear olefinic unsaturation into the base polymer must provide allylic hydrogen to the product polymer, that is, the latter must contain at least one hydrogen on at least one of the carbons adjacent to the double bond carbons. Furthermore, it is necessary in the product polymer that there be no more than one hydrogen atom on each of the double bond carbons. The choice of reactant will depend upon the reaction involved in preparing the product polymer. Thus, if the reaction is one of addition polymerization, 1,3-butadiene, isoprene and 2,3-dimethyl-1,3-butadiene will not provide satisfactory products, whereas they will when used in a Diels-Alder reaction, as with an unsaturated polyester. In an addition polymerization reaction it is necessary to use a reactant such as 5-ethylidene-2-norbornene to obtain the desired extralinear unsaturation. In an esterification reaction, it is only necessary that the acid, acid halide, acid anhydride or ester reactant contain the desirec unsaturation somewhere in the molecule. Thus, depending upon the reaction involved, suitable reactants are exemplified by those which provide olefinic units such as those existing in butene-2, trimethyl ethylene, tetramethyl ethylene, 1,2-dimethyl cyclohexene, 2-ethylidene-norbornane, 2-methyl-2-norbornene, 2,3-dimethyl-2-norbornene, cyclopentene, 1-methyl cyclopentene, 1,2-dimethyl cyclopentene, α, β, β'-trimethyl styrene, indene and alkyl-substituted indenes, and alkyl-substituted furans.

More generally, suitable reactants for introducing the extralinear olefinic unsaturation into the base polymer are exemplified by those which provide olefinic units corresponding to those of the general formula

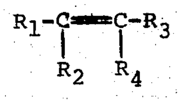

wherein the $R_1$, $R_2$, $R_3$ and $R_4$ substituents may be hydrogen, an alkyl group containing one to 20 carbon atoms, an aryl group or a substituted aryl group. Furthermore, $R_1$ and $R_2$, $R_3$ and $R_4$, $R_1$ and $R_3$ and $R_2$ and $R_4$ may be combined in the form of an alicyclic or heterocyclic ring. However, one of the R's must contain the

group in order that at least one allylic hydrogen atom is present, and at any one time, when any of the R's is hydrogen, there can be no more than one hydrogen on each of the double bond carbons.

When the R's are alkyl, they may be straight chain alkyl, such as methyl, ethyl, n-propyl, n-butyl, n-amyl, n-hexyl, or octadecyl. Moreover one of them may be a branched chain alkyl, such as isopropyl, isobutyl, t-butyl and isoamyl, as long as none of the remaining R's is branched. Also, one of the R's may be an unsaturated alkyl group containing a carbon-carbon double bond in conjugation with the olefinic double bond. When the R's are aryl, there normally will be no more than two of them which are aryl and they ordinarily will be singly substituted on the double bond carbons. The aryl substituents, such as phenyl and naphthyl, also may themselves be substituted with —R', —OR',

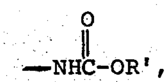

—Cl, —Br and —F substituents, wherein R' is an alkyl group containing one to six carbon atoms, or is aryl, such as phenyl. Furthermore, if only one of the R's is aryl, then the aryl group may contain a —CN,

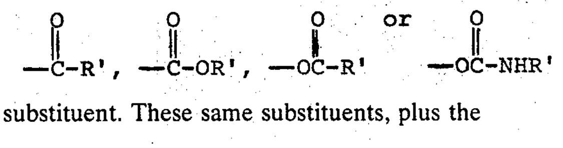

substituent. These same substituents, plus the

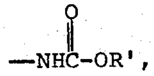

—Cl, —Br and —F substituents listed earlier, also may occur elsewhere in the polymer molecule provided they are separated from the extralinear olefinic unsaturation in the polymer by at least one carbon atom, and preferably by two or more carbon atoms.

The sensitizers used in the process of this invention are generally well known and are characterized as being useful in photosensitized oxidations. Thus, they are photooxygenation sensitizers. Among the best sensitizers are those which absorb visible light, in the range of about 4000 to about 8000 angstroms, namely, fluorescein derivatives, xanthene dyes, porphyrins and porphins, and polycyclic aromatic hydrocarbons. The sensitizers uxed in the examples were methylene blue, rose bengal, meso-tetraphenylporphin, and those shown in Example 31. Of these, the preferred sensitizers are methylene blue and zinc tetraphenylporphin. Additional sensitizers useful with visible light (4000 to 8000 angstroms) or ultraviolet light (2000 to 4000 angstroms), depending on their absorption, are hemin, chlorophyll, prophyrazines, octaphenylporphines, benzoporphines, fluorene, triphenylene, phenanthrene, naphthalene, chrysene, pyrene, 1,2-benzanthracene, acenaphthylene, azulene, phthalocyanines, hypericin, 3,4-benzpyrene, 20-methylcholanthrene, anthracene, tetracene, acridine, rubrene, carbazole, benzophenone, 2-chlorobenzophenone, 4,-chlorobenzophenone, 4-methoxybenzophenone, 2-methylbenzophenone, 4-methylbenzophenone, 4,4'-dimethylbenzophenone, 4,-4'-bis-(dimethylamino)benzophenone, 4-bromobenzophenone, 2,2',4,4'-tetrachlorobenzophenone, 2-chloro-4'-methylbenzophenone, 4-chloro-4'-methylbenzophenone, 3-methylbenzophenone, 2-phenylbenzophenone, 4-phenylbenzophenone, 4-tert-butylbenzophenone, benzoin, benzoin methyl ether, benzoin ethyl ether, benzoin isopropyl ether, benzoin acetate, desoxybenzoin, benzil, benzilic acid, acetophenone, benzylacetophenone, benzalacetophenone, 9,10-phenanthrenequinone, fluorenone, xanthone, anthrone, α-indanone, 1,4-naphthoquinone, phenyl-1-napthyl ketone, 1-acetonaphthone, 2-acetonaphthone and 1-naphthaldehyde.

The amount of sensitizer is not critical, but the best results are obtained when the concentration is adjusted so that more than 90% of the incident light is absorbed at the wavelength corresponding to the absorption maximum of the particular sensitizer employed. The sensitizer may be applied as a surface coating to the photopolymer film, diffused into the film with a suitable solvent, or incorporated into the polymer when the film is being formed. With appropriate selection of sensitizer, the reaction may be carried out using light having a wave length of from about 2000 to about 12,000 angstroms, preferably from about 3000 to about 8000 angstroms. The oxygen required for the reaction normally is obtained from the air present. However, an atmosphere of pure oxygen may be provided, if desired.

After the polymer hydroperoxides have been formed in the first step of the process of this invention, one of the subsequent procedures involves contacting the polymer hydroperoxides with a vinyl monomer in the presence of a redox catalyst. The preferred redox catalysts are salts or complexes of metals capable of existing in more than one valence state. Vanadium oxyacetylacetonate, vanadium oxysulfate, titanyl acetylacetonate, ferric acetylacetonate-benzoin, manganese octoate, lead naphthenate and cobaltic acetylacetonate are among the preferred redox catalysts, which also include cobaltous naphthenate, cobaltous 2-ethyl hexanoate, cobaltous stearate, cobaltic stearate, coabltous acetylacetonate, manganous stearate, manganic stearate, manganous acetylacetonate, manganic acetylacetonate, manganese naphthenate, zirconium acetylacetonate, vanadyl naphthenate, cadmium acetate, ferrous sulfate, ferrous pyrophosphate, ferrous sulfide, the ferrous complex of ethylenedinitrilotetraacetic acid, ferrous o-phenanthroline, ferrous ferrocyanide, ferrous acetytacetonate and the corresponding nickel, copper, mercury and chromium compounds. Reducing agents which can also be used include polyamines such as diethylenetriamine, triethylene tetraamine, tetraethylenepentamine, monoamines, sodium hyposulfite and sulfur dioxide. Grafting in the presence of a vinyl monomer can also be initiated thermally.

The redox catalyst, reducing agent or heat acts upon the hydroperoxide groups on the polymer to decompose them to provide a free radical source for the initiation of graft polymerization of the vinyl monomer at the site of the hydroperoxide groups on the polymer. Any vinyl monomer or mixture of monomers capable of being polymerized in a catalyst-hydroperoxide initiated reaction may be grafted to the polymer film. The examples have shown arcylamide, acrylic acid, dimethylacrylamide, hydroxymethyl acrylamide, polyethylene glycol diacrylate, glycidyl acrylate, vinylbenzyl chloride, sodium 2-sulfoethylmethacrylate, methacryloxyethyltrimethylammonium methylsulfate and methacryloxyethyltrimethylammonium chloride. Additional suitable monomers are N,N-dimethylaminoethyl acrylate, N,N-dimethylaminoethyl methacrylate, N,N-diethylaminoethyl acrylate, N,N-diethylaminoethyl methacrylate, hydroxyethyl acrylate, hydroxyethyl methacrylate, glycerol acrylate, glycerol methacrylate, hydroxyethyl acrylamide, methacrylic acid, itaconic acid, sodium ethylenesulfonate, sodium sulfoethylacrylate, sodium sulfopropylmethacrylate, sodium sulfopropylacrylate, sodium 2-acrylamido-2-methylpropanesulfonate, acrylyl chloride, methacrylyl chloride and itaconyl chloride.

The graft polymer prepared according to the above procedure may then have its hydrophilic or oleophilic properties, as the case may be, enhanced by amplification with a reactant which is of the same type and capable of reaction with a functional group of the graft polymer. Using the same technique, the surface properties of the graft polymer can be inverted. For example, a graft polymer originally having oleophilic surface properties can be converted to one having hydrophilic surface properties. This also is amplification in that the mass of the light-struck areas is increased. The amplification reaction may involve ionic or covalent bond formation between the graft polymer and the amplification reactant. For example, if the functional group is anionic, amplification is accomplished by contacting the graft polymer with a cationic reactant. Similarly, if the functional group is cationic, the amplification is accomplished by contacting the graft polymer with an anionic reactant. Such reactions may be considered analogous to salt formation in acid-base reactions. In the case of amplification by covalent bond formation, the functional group of the graft polymer is chosen so that it will be capable of reaction with the desired amplification reactant. Any reaction capable of joining two polymers by a covalent bond will be applicable, the combination of reactants being selected on the basis of availability, ease of reaction and the desired properties of the final product.

Typical anionic amplification agents are the sodium sulfopropylacrylate-acrylamide copolymer of Example 3, as well as poly(acrylic acid), poly(sodium acrylate), poly(sodium ethylenesulfonate) poly(itaconic acid), poly(methacrylic acid), poly(sodium methacrylate), poly(sodium sulfoethylmethacrylate), poly(sodium sulfopropylacrylate), poly(sodium 2-acrylamido-2-methylpropanesulfonate), and copolymers of these materials with acrylamide. Typical cationic amplification agents are the poly(methacryloxyethyltrimethylammonium methylsulfate) of Example 2; the polyethylenimines of Examples 1 and 7; the polymers and copolymers of N,N-dimethylaminoethyl acrylate, N,N-dimethylaminoethyl methacrylate, N,N-diethylaminoethyl acrylate, N,N-diethylaminoethyl methacrylate; inorganic bases such as sodium hydroxide; metal salts as in Examples 27–30, organic bases such as primary, secondary and tertiary amines, including diamines such as ethylenediamine and triamines such as diethylenetriamine. Typical combinations for grafting by means of covalent bonding are illustrated by the reaction of grafted glycidyl acrylate with polyethylenimine, as in Example 32, and the reaction of grafted vinylbenzyl chloride with polyethylenimine, as in Example 33.

In the alternative method of grafting, wherein the photooxidized film is contacted with a polymeric reactant capable of reacting with an epoxide ring, the unsaturated polymer films, sensitizers and light sources described for the graft polymerization procedure are also applicable. The surface of the polymer film may be provided with a transition metal salt catalyst capable of converting polymer hydroperoxides and residual polymer unsaturation to polymer epoxides. Thus, salts of molybdenum, vanadium, tungsten, titanium, chromium, selenium, zirconium, niobium, tellurium, tantalum, rhenium, and uranium are useful. Specific examples of such salts are molybdenum hexacarbonyl, molybdenum naphthenate, molybdenum pentachloride, molybdenyl acetylacetonate, molybdenum octoate, sodium molybdate, sodium vanadate, sodium tungstate, vanadium oxyacetylacetonate and chromium acetylacetonate.

Grafting is effected by contacting the photooxidized polymer film with a polymeric reactant capable of reacting with an epoxide. Exemplary of such materials are poly(ethylenimine), poly(aminoethyl acrylate), poly(aminoethyl methacrylate), poly-(aminopropyl acrylate), poly(aminopropyl methacrylate), poly-(acrylic acid), poly(methacrylic acid), poly(itaconic acid), as well as copolymers of these materials, polyfunctional primary and secondary amines and polymers containing anhydride groups. The graft polymers prepared by this procedure may be subjected to the same type of amplification as described earlier for the graft polymers prepared from the polymer hydroperoxides and vinyl monomers.

In the preparation of some of the photopolymer components used in the process of this invention, for example the modified polyester of Example 1, it may be desirable to have present a small amount of a phenolic antioxidant to act as an inhibitor for possible thermal oxidation reactions. Such antioxidants are well known in the art and they are exemplified by hydroquinone, di-t-butyl-p-cresol, hydroquinone monomethylether, pyrogallol, quinone, t-butyl-catechol, hydroquinone monobenzylether, methyl hydroquinone, amyl quinone, amyloxy hydroquinone, n-butyl phenol, phenol and hydroquinone monopropyl ether. The phenolic antioxidant may be used in an amount within the range of from about 0.001 to about 2% by weight, preferably about 1% by weight, based on the base polymer component.

The photopolymer compositions of the process of this invention may be cast from solution onto a suitable support. Ordinarily, the support member of a lithographic plate is metal-surfaced or composed of entire sheets of metal. Metals such as aluminum, zinc, copper, chromium, tin, magnesium and steel may be used. Aluminum and zinc are preferred. However, other supports or backing members may be employed, such as polyester film or paper. For example, a paper sheet or plate suitably backed or the paper sheet impregnated with a thermosetting resin such as a phenol-formaldehyde resin can be employed. In the case of metallic surfaces, oxides may be present, either through exposure to air or through special treatment. For example, in the case of aluminum, the surface may, if desired, be chemically or electrolytically anodized. In casting the polymer component onto a suitable support, a suitable solution of the polymer component may be used, and conventional coating techniques may be employed.

Alternatively, those photopolymer compositions of the process of this invention which are thermoplastic may be thermoformed in plastic fabrication equipment onto a metal or synthetic resin substrate. In so doing, up to 60% by weight of an inert particulate filler may be added. Representative fillers are the organophilic silicas, the bentonites, silica and powdered glass, such fillers preferably having a particle size of 0.1 micron or less. The ingredients of the composition may first be dry-blended and then further mixed by two-roll milling or extrusion. This mixture then is fabricated into, for example, a lithographic plate by compression molding or extrusion onto a metal or synthetic resin backing.

What we claim and desire to protect by Letters Patent is:

1. The process of making a photographic image which comprises providing the surface of a polymer film with a photo-oxygenation sensitizer, said film being a film of a polymer containing extralinear olefinic unsaturation of the type in which there is no more than one hydrogen atom on each of the double bond carbons and in which there is at least one allylic hydrogen on at least one of the carbons adjacent to the double bond carbons, exposing selected areas of the sensitized film to light having a wave length of from about 2000 to about 12,000 angstroms in the presence of oxygen, and subjecting the exposed film to contact with a reactant capable of forming a graft polymer structure in the exposed areas of the film.

2. The process of claim 1 wherein the light has a wave length of from about 3000 to about 8000 angstroms.

3. The process of claim 1 wherein the light has a wave length of from about 4000 to about 8000 angstroms.

4. The process of claim 1 wherein the exposed film after contact with the reactant to produce the graft polymer structure is contacted with a dye, thereby providing a colored image.

5. The process of claim 1 wherein the exposed film after contact with the reactant to produce the graft polymer structure is further contacted with a different reactant which is capable of reaction with the functional groups of the graft polymer, thereby effecting amplification of the graft polymer structure.

6. The process of claim 1 wherein the exposed film is contacted with a polymeric reactant capable of reacting with an epoxide ring.

7. The process of claim 6 wherein the surface of the unexposed polymer film also is provided with a transition metal catalyst.

8. The process of claim 6 wherein the exposed film after contact with the polymeric reactant is contacted with a dye, thereby providing a colored image.

9. The process of claim 6 wherein the polymer film is oleophilic and the polymeric reactant is hydrophilic.

10. The process of claim 9 wherein the polymeric reactant is polyethylenimine.

11. The process of claim 1 wherein the exposed film is contacted with a vinyl monomer in the presence of a reducing agent.

12. The process of claim 11 wherein the polymer film is oleophilic and the vinyl monomer is hydrophilic.

13. The process of claim 12 wherein the vinyl monomer is acrylamide.

14. The process of claim 12 wherein the vinyl monomer is dimethylacrylamide.

15. The process of claim 12 wherein the vinyl monomer is hydroxymethyl acrylamide.

16. The process of claim 12 wherein the vinyl monomer is polyethylene glycol diacrylate.

17. The process of claim 11 wherein the exposed film after contact with the vinyl monomer to produce the graft polymer structure is further contacted with a different reactant which is capable of reaction with the functional groups of the graft polymer, thereby effecting amplification of the graft polymer structure.

18. The process of claim 17 wherein the polymer film is oleophilic, the vinyl monomer is oleophilic and the amplification reactant is hydrophilic.

19. The process of claim 18 wherein the vinyl monomer is glycidyl acrylate and the amplification reactant is polyethylenimine.

20. The process of claim 18 wherein the vinyl monomer is vinylbenzyl chloride and the amplification reactant is polyethylenimine.

21. The process of claim 17 wherein the polymer film is oleophilic, the vinyl monomer is hydrophilic and the amplification reactant is hydrophilic.

22. The process of claim 21 wherein the vinyl monomer is acrylic acid and the amplification reactant is polyethylenimine.

23. The process of claim 21 wherein the vinyl monomer is acrylic acid and the amplification reactant is poly(methacryloxyethyltrimethylammonium methylsulfate).

24. The process of claim 21 wherein the vinyl monomer is methacryloxyethyltrimethylammonium methylsulfate and the amplification reactant is a copolymer of sodium sulfopropylacrylate and acrylamide.

25. A photopolymer element prepared according to the process of claim 1.

26. The photopolymer element of claim 25 wherein the element is a lithographic plate.

* * * * *